United States Patent [19]

Nishio et al.

[11] Patent Number: 5,041,186

[45] Date of Patent: Aug. 20, 1991

[54] METHOD FOR MANUFACTURING COMPOUND SEMICONDUCTOR SINGLE CRYSTALS USING A HYDROGEN MONITOR GAS

[75] Inventors: Johji Nishio, Yokohama; Takashi Fujii, Yamato, both of Japan

[73] Assignee: Kabushiki Kaisha Toshiba, Kawasaki, Japan

[21] Appl. No.: 278,209

[22] Filed: Nov. 30, 1988

[30] Foreign Application Priority Data

Nov. 30, 1987 [JP] Japan .................................. 62-299757
Jul. 14, 1988 [JP] Japan .................................. 63-173704

[51] Int. Cl.$^5$ ...................... C01G 15/00; C01G 28/00
[52] U.S. Cl. .............................. 156/620.2; 156/617.1; 156/601; 156/607
[58] Field of Search ............... 156/601, 605, 606, 607, 156/617.1, 620.2, DIG. 70

[56] References Cited

U.S. PATENT DOCUMENTS

| 4,400,232 | 8/1983 | Ownby et al. | 156/601 |
| 4,678,534 | 7/1987 | Tada et al. | 156/607 |

FOREIGN PATENT DOCUMENTS

| 0131599 | 7/1984 | Japan | 156/607 |
| 0197499 | 9/1986 | Japan | 156/620.2 |
| 0030700 | 2/1987 | Japan | 156/607 |
| 3159291 | 7/1988 | Japan | 156/607 |
| 3215592 | 9/1988 | Japan | 156/617.1 |
| 1126292 | 5/1989 | Japan | 156/617.1 |
| 1138190 | 5/1989 | Japan | 156/617.1 |
| 1211915 | 8/1989 | Japan | 156/617.1 |
| 1215799 | 8/1989 | Japan | 156/620.2 |
| 0355833 | 2/1990 | Japan | 156/620.2 |
| 2212976 | 8/1989 | United Kingdom . | |

OTHER PUBLICATIONS

Little, "High-Pressure Crystal Growing Furnace", Solid State Technology, vol. 13, No. 10, Oct. 1970, pp. 28-58.

Applied Physics Letter, vol. 50, No. 3, pp. 143-145, "Growth of Semi-Insulating GaAs Crystals with Low Carbon Concentration Using Pyrolytic Boron Nitride Coated Graphite"; T. Inada et al., 19, Jan. 87.

J. Nishio et al., Gas Phase Contribution to Carbon Incorporation and Extraction Mechanisms for LEC GaAs, Journal of Crystal Growth, 99, (1990) 680-684.

*Primary Examiner*—Olik Chaudhuri
*Assistant Examiner*—M. Wilczewski
*Attorney, Agent, or Firm*—Oblon, Spivak, McClelland, Maier & Neustadt

[57] ABSTRACT

Disclosed is a method of manufacturing a compound semiconductor single crystal, wherein a container containing a raw melt is placed in an atmosphere containing at least one monitor gas selected from the group consisting of hydrogen, oxygen, carbon monoxide, and carbon dioxide, a concentration of the monitor gas in the atmosphere is detected, and the detected concentration of the monitor gas is controlled to be a preset value. A compound semiconductor single crystal having a uniform carrier concentration can be obtained by controlling the concentration of the monitor gas.

15 Claims, 4 Drawing Sheets

METHOD FOR MANUFACTURING COMPOUND SEMICONDUCTOR SINGLE CRYSTALS USING A HYDROGEN MONITOR GAS

BACKGROUND OF THE INVENTION

1. Field of the Invention

The present invention relates to the manufacture of a compound semiconductor single crystal and, more particularly, to a method and apparatus for manufacturing a compound semiconductor single crystal capable of growing a single crystal having a uniform carrier concentration.

2. Description of the Related Art

In recent years, compound semiconductor single crystals such as GaAs, GaP, InP, and the like are used as substrate materials of various semiconductor devices. These single crystals are manufactured by the Czochralski method, the Bridgman method, and the like. In these methods, if a semiconductor single crystal is manufactured by growing a single crystal from a raw melt, oxygen, carbon, and the like remain in the resultant single crystal as residual impurities. These impurities are produced from graphite normally used as a material for a heater or other furnace members, and are mixed in the raw melt through an atmosphere.

Oxygen, carbon, and the like as the residual impurities in the single crystal normally exhibit a change in concentration along the growth direction of the single crystal, and the change in concentration adversely influences electrical characteristics of a semiconductor single crystal and causes the following disadvantages.

First, desired electrical characteristics are obtained by doping a certain impurity in the single crystal. The electrical characteristics are influenced by the change in concentration of the residual impurity along the growth direction of the single crystal, as described above. Therefore, it is difficult to control the electrical characteristics to be uniform throughout one single crystal ingot. Therefore, the desired electrical characteristics can be obtained from only a limited portion of the single crystal ingot, resulting in very low product yield.

Second, when a semi-insulating GaAs single crystal is manufactured by a liquid encapsulated Czochralski method (LEC method), a carbon concentration in the resultant single crystal ingot tends to be high in a head portion of the ingot and be lowered toward the tail portion. Therefore, when a semiconductor device is manufactured using a substrate prepared from the head portion of the ingot having a large carbon content, the resistance of the substrate is decreased during a heat-treatment process, and a desired semiconductor device cannot be obtained. If the carbon concentration is too low, a semi-insulating property is often already lost and a resistance becomes low when the single crystal is manufactured.

A GaAs single crystal of the compound semiconductor single crystals is widely used as a substrate material for a variety of semiconductor devices, such as a light-emitting device, e.g., a light-emitting diode, a semiconductor laser or the like, a high frequency field effect transistor, a Hall device, and the like. When the GaAs single crystal is used as the substrate material of the light-emitting device, a high-concentration n-type GaAs single crystal is normally used. Recently, a technique of fabricating a light-emitting device on a p-type GaAs single crystal substrate of a high carrier concentration ($10^{17}$ to $10^{20}$ /cm$^3$) has been developed, and a p-type GaAs single crystal has also become popular. As an impurity for the p-type GaAs single crystal, zinc is normally used. However, since the zinc is solid, it must be doped in a raw melt. In addition, since the zinc has a segregation coefficient of about 0.3 with respect to GaAs, the carrier concentration of the head portion of the growth of the single crystal ingot is ten times or more of that of the tall portion. Since the boiling point of the zinc is as low as 906° C., it is very difficult to dope the zinc with high controllability.

In a field effect transistor, element isolation becomes difficult to achieve along with further micropatterning of devices. For this reason, a method of producing a device using a p-type GaAs single crystal substrate of a low carrier concentration ($10^{14}$ to $10^{17}$ /cm$^3$) is proposed. However, the substrate for the field effect transistor has a very strict specification as compared to that of a light-emitting device. As described above, a zinc-doped p-type GaAs single crystal has low reproducibility of a carrier concentration among crystal ingots, and a carrier concentration is also largely varied in one crystal ingot due to its segregation coefficient. For this reason, it is very difficult to obtain a p-type GaAs single crystal for a substrate of the field effect transistor.

As described above, a p-type GaAs single crystal with a controlled carrier concentration is demanded. However, as long as zinc is used as a dopant, it is very difficult to control a carrier concentration to be uniform not only among a plurality of crystal ingots but even in one crystal ingot.

In consideration of the above situation, the present inventors examined various impurities as a p-type impurity in to replace zinc. It has been found that carbon can be used as a p-type impurity, and that carbon can be doped in a gas state, e.g., CO or $CO_2$.

If an apparatus as a combination of a conventional GaAs single crystal pull device and a carbon supplying system is used, a p-type GaAs single crystal can be obtained. However, the carbon concentration of the resultant single crystal cannot be controlled to a desired value. Furthermore, even if a supply amount of a gas as a carbon source is controlled to be constant, it is difficult to maintain the carrier concentration of the resultant GaAs single crystal to be constant.

SUMMARY OF THE INVENTION

It is an object of the present invention to provide a method of manufacturing a compound semiconductor single crystal capable of controlling a carrier concentration to be uniform.

It is another object of the present invention to provide an apparatus used for the manufacturing method.

According to the present invention, there is provided a method of manufacturing a compound semiconductor single crystal, comprising the steps of: placing a container containing a raw melt in an atmosphere containing at least one monitor gas selected from the group consisting of hydrogen, oxygen, carbon monoxide, and carbon dioxide; detecting a concentration of the monitor gas in the atmosphere; and controlling the detected concentration of the monitor gas to be a preset value.

In the method of the present invention, the monitor gas can be supplied in a chamber housing the container together with a dilution gas, and can be exhausted therefrom together with the dilution gas. In this case, control of the monitor gas concentration can be performed by controlling supply of the monitor gas and/or dilution gas into the chamber, and/or exhaust of the monitor gas and dilution gas from the chamber. Such control can be made by adjusting the degree of opening of valves attached to monitor and dilution gas supply pipes and to monitor and dilution gas exhaust pipes.

The preset value to which the concentration of the monitor gas is controlled can be a value which is set according to a pull weight of a single crystal and is normally a constant value.

A compound semiconductor single crystal obtained by the method of the present invention includes a group III-V compound semiconductor single crystal. The group III-V compound semiconductor includes GaAs, GaP, InP, and the like.

An n-type GaAs single crystal can be obtained from a GaAs raw melt containing an n-type impurity. As the n-type impurity, silicon can be used.

A p-type GaAs single crystal can be obtained from a GaAs raw melt containing a p-type impurity. As the p-type impurity, carbon can be used.

Furthermore, according to the present invention, there is provided an apparatus for manufacturing a compound semiconductor single crystal, comprising: a crystal growth chamber; a container, placed in the chamber, for containing a compound semiconductor raw material; heating means for heating and melting the compound semiconductor raw material in the container; means for growing a compound semiconductor single crystal from a raw melt obtained by heating and melting the compound semiconductor raw material; means for supplying at least one monitor gas selected from the group consisting of hydrogen, oxygen, carbon monoxide, and carbon dioxide into the chamber; means for detecting a concentration of the monitor gas in the chamber; and means for comparing the detected concentration of the monitor gas with a preset concentration of the monitor gas to control the concentration of the monitor gas in the chamber.

When a graphite heating element is used as the heating means, the heating element serves as a carbon source, and a CO or $CO_2$ concentration in an atmosphere is varied. Therefore, control of the gas concentration is particularly necessary. Control of the gas concentration can be made by adjusting the degrees of opening of valves attached to monitor and dilution gas supply pipes and to monitor and dilution gas exhaust pipes based on an instruction from a computer.

DETAILED DESCRIPTION OF THE PREFERRED EMBODIMENTS

Figure 1:
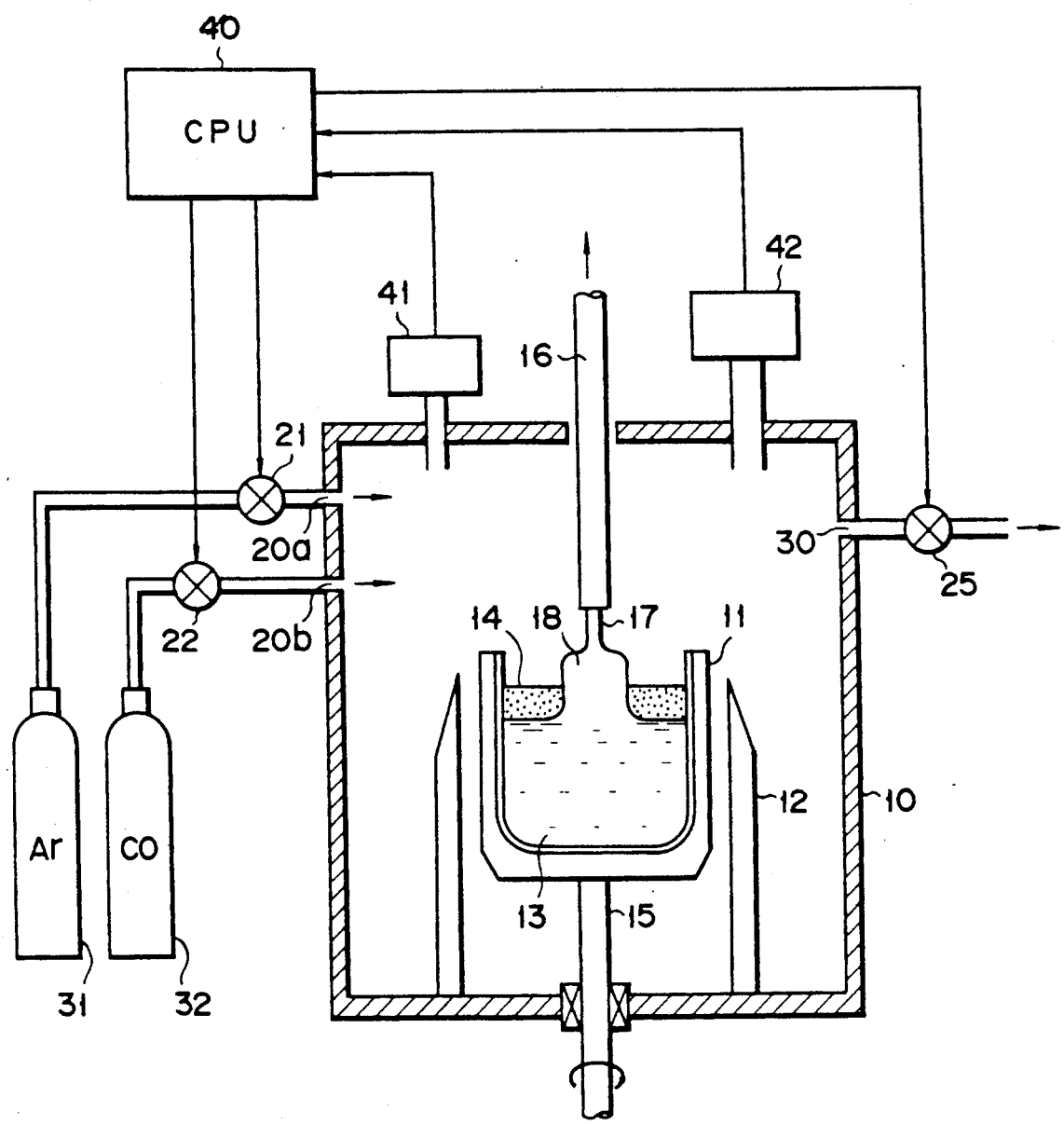
FIG. 1 is a diagram showing a GaAs single crystal manufacturing apparatus according to an embodiment of the present invention.

A single crystal in which a residual impurity is maintained to be a constant value throughout an entire ingot can be obtained according to the method of the present invention for the following reason.

When a compound semiconductor single crystal is grown from a raw melt, the concentration of an impurity mixed in the single crystal is uniquely determined by the impurity concentration and a segregation coefficient when no impurity exchange is present between the raw melt and the atmosphere, or by a solidification rate of the single crystal when the growth condition of the single crystal is uniform.

However, the present inventors found that if oxygen, carbon monoxide and the like are present in the atmosphere around the raw melt, these impurities are mixed in the raw melt. The present inventors also found contents of that oxygen, carbon monoxide, and the like in the atmosphere are increased along with the time elapse (as the crystal is grown). When a compound semiconductor single crystal is manufactured by the LEC method or the like, exchange of carbon is complex. For example, mixing in of carbon from carbon monoxide is suppressed due to the presence of a liquid sealant ($B_2O_3$), carbon in the raw melt is bettered by $B_2O_3$, and such exchange of carbon is changed according to a hydrogen concentration in the atmosphere, and so on.

As described above, oxygen or carbon (carbon monoxide) is exchanged between the raw melt and the atmosphere (in the LEC method, through a liquid sealant layer). Therefore, the concentration of oxygen or carbon monoxide in the atmosphere is detected, and is controlled to be constant in a predetermined period of time (time wherein a crystal is grown to a predetermined length), so that mixing in of oxygen or carbon into a compound semiconductor single crystal can be maintained constant throughout the entire single crystal ingot.

When a p-type GaAs single crystal is manufactured, carbon can be used as a p-type impurity. Unlike zinc, carbon is a typical element, and is a very stable element in a GaAs single crystal. For this reason, as compared to a case wherein zinc is used as a p-type impurity, a very stable p-type GaAs single crystal can be obtained. When CO or $CO_2$ gas is used as a carbon source and the concentration of the gas in the atmosphere is controlled to be constant, a doping amount of carbon in the GaAs single crystal can be accurately controlled. In this manner, according to the present invention, a p-type GaAs single crystal having a uniform carrier concentration can be manufactured.

According to the present invention, when an n-type GaAs single crystal is manufactured, silicon is used as an n-type impurity, and can be doped in a raw melt. In this case, since the silicon as the n-type impurity causes the following reaction with a water content in a liquid sealant, its addition efficiency is not so good:

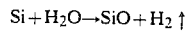

As the n-type GaAs single crystal is grown, the reaction progresses along with the time, and the water content in the liquid sealant is decreased. For this reason, in the head portion of growth, doping efficiency is poor. However, as the growth progresses, the doping efficiency becomes better. As a result, since the silicon concentration in the single crystal is changed along the longitudinal direction of the single crystal, the carrier concentration becomes nonuniform in the longitudinal direction of the single crystal.

In this case, if a high hydrogen concentration is set in the atmosphere in the head portion of growth of the single crystal, the above reaction can be suppressed. Therefore, based on this finding, the hydrogen concentration in the atmosphere is detected and controlled, so that the doping efficiency of silicon can be controlled along with growth. As a result, a single crystal having a uniform silicon concentration in the longitudinal direction thereof can be obtained.

The $O_2$ and CO (or $CO_2$) concentrations in the atmosphere are detected and controlled as well as detection and control of the hydrogen concentration in the atmosphere, so that the concentrations of oxygen and carbon defining an acceptor level in the single crystal can be uniformed in the longitudinal direction of a single crystal ingot.

The present invention will now be described in detail with reference to the illustrated embodiments.

FIG. 1 is a schematic diagram showing a GaAs single crystal manufacturing apparatus according to an embodiment of the present invention. This apparatus embodies the LEC method.

In FIG. 1, reference numeral 10 denotes a high-pressure chamber, in which crucible 11 (raw material container) 11 and heater 12 are disposed. Crucible 11 contains raw melt 13 and liquid sealant 14 of, e.g., $B_2O_3$. Note that raw melt 13 and sealant 14 are separated in a two-layered state such that after the raw material of GaAs crystal and boric oxide are charged in crucible 11, they are heated and melted. Crucible 11 is attached to rotating shaft 15 to be rotated and vertically moved. Heater 12 is formed of graphite, and is arranged concentrically with crucible 11 to surround it.

Upon manufacture of a crystal, seed crystal 17 attached to the lower end of pull shaft 16 is brought into contact with GaAs melt 13 through liquid sealant 14, so that the seed crystal is wetted with melt 13. Thereafter, pull shaft 16 is gradually moved upward, so that GaAs single crystal 18 is pulled and manufactured.

The above-mentioned arrangement is the same as a conventional apparatus. The apparatus of the present invention is different from the conventional apparatus in the following points. That is, gas inlet ports 20a and 20b are formed in chamber 10, and are connected to gas cylinders 31 and 32 through electromagnetic valves 21 and 22. First gas cylinder 31 contains an inert gas, e.g., argon gas, and second gas cylinder 32 contains an inert gas, e.g., argon gas containing CO or $CO_2$ as a carbon supply source. Gas exhaust port 30 is also formed in chamber 10, and is connected to a vacuum pump (not shown) through electromagnetic valve 25.

Chamber 10 is connected to pressure sensor 41 for detecting a gas pressure in chamber 10, and gas analyzer 42 for analyzing the type and the content of gas. Output signals from pressure sensor 41 and gas analyzer 42 are supplied to CPU 40. CPU 40 obtains a carbon concentration based on the input data signals, i.e., the gas pressure signal and gas type signal, and controls the degrees of opening of electromagnetic valves 21, 22, and 25 based on the measured carbon concentration and a preset carbon concentration. Thus, the carbon concentration in chamber 10 can be maintained constant.

A method of manufacturing a p-type GaAs single crystal using the above-mentioned apparatus will now be described. In this embodiment, 1 kg of GaAs prepared by direct synthesis of gallium and arsenic were charged in pyrolytic boron nitride (PBN) crucible 11 as a raw melt, and 150 g of $B_2O_3$ with low water content were used as a sealant. The prepared GaAs crystal had a diameter of 50 mm and a length of 100 mm. An inert gas used in the manufacture of the crystal was high-purity argon gas, and a carbon supply source was high-purity argon containing 10% of CO. A gas mass analyzer was used for analyzing gases in chamber 10. The CO concentration was detected based on the relationship between the analysis result and the gas pressure, thus estimating the CO concentration in chamber 10.

Figure 2:
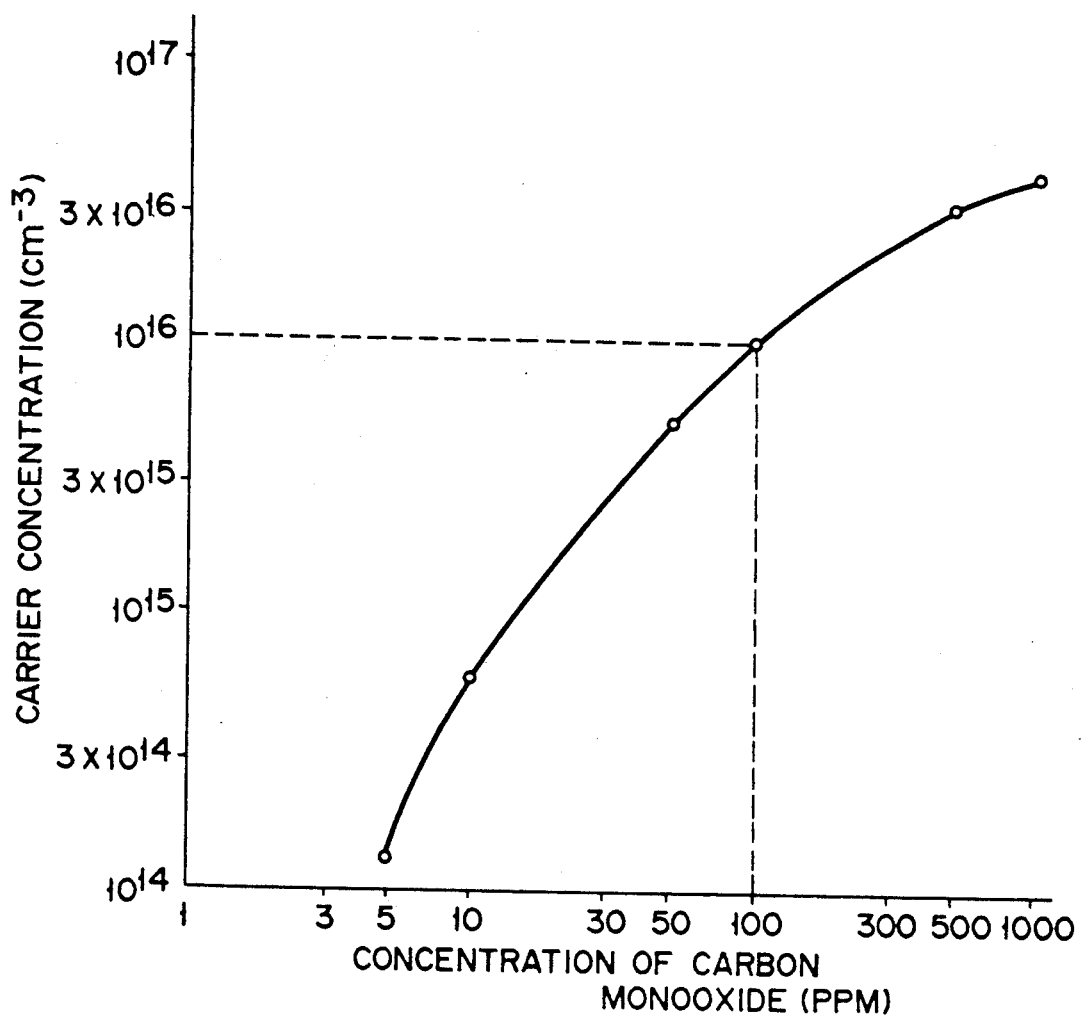
FIG. 2 is a graph showing the relationship between a carbon concentration in an atmosphere and a carrier concentration in a manufactured GaAs single crystal.

First, a correspondence between the CO concentration in high-pressure chamber 10 and a carrier concentration of the GaAs single crystal was examined. FIG. 2 shows the relationship between the CO concentration in an atmospheric gas and the carrier concentration of the GaAs crystal. From this result, in this embodiment, an attempt was made to produce a crystal having a carrier concentration of $1 \times 10^{16}$ cm$^{-3}$. As can be seen from FIG. 2, in order to obtain the above crystal, the CO concentration in the atmospheric gas must be 100 ppm. The CO concentration of the atmospheric gas was controlled to 100 ppm using the apparatus shown in FIG. 1 to perform crystal growth.

Figures 5, 6:
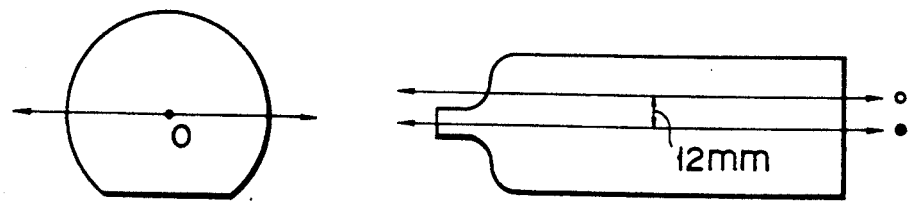
FIG. 5 is a view showing a surface of a wafer obtained from the GaAs single crystal ingot according to the embodiment of the present invention.
FIG. 6 is a view showing a longitudinal direction of the GaAs single crystal ingot obtained according to the embodiment of the present invention.
Figure 3:
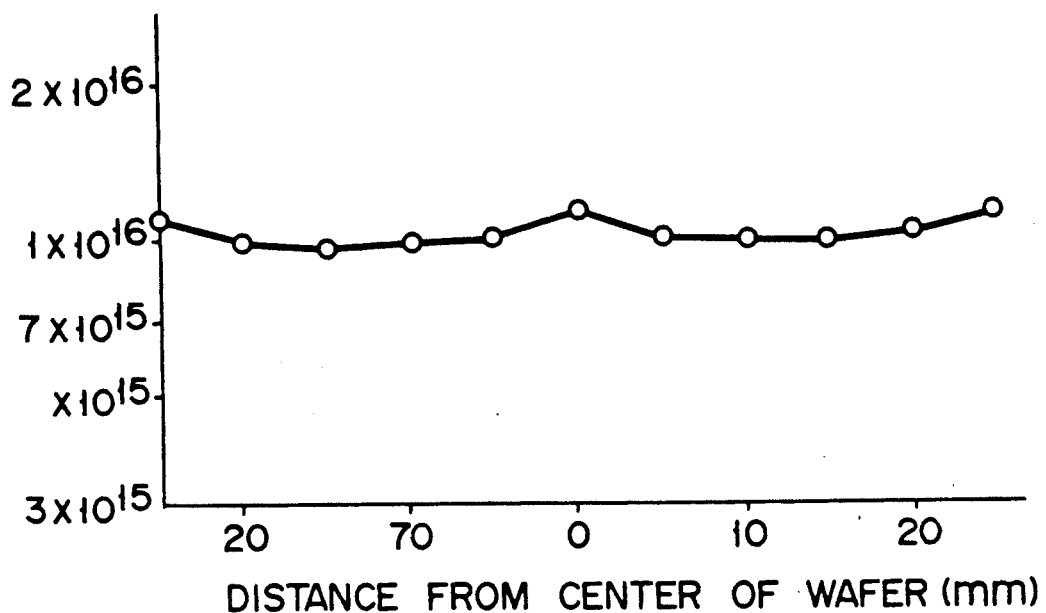
FIG. 3 is a graph showing a carrier concentration at respective positions of a wafer obtained from a GaAs single crystal ingot according to the embodiment of the present invention.
Figure 4:
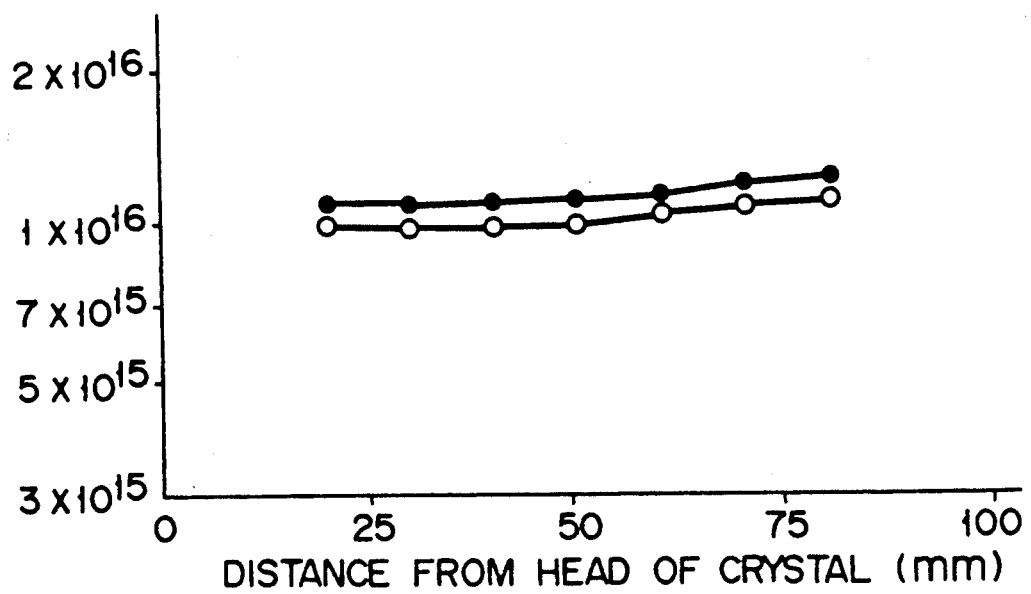
FIG. 4 is a graph showing a carrier concentration at respective positions in the longitudinal direction of the GaAs single crystal ingot obtained according to the embodiment of the present invention.

FIGS. 3 and 4 show a carrier concentration distribution of the produced crystal. FIG. 3 shows a carrier concentration distribution in the wafer surface in a direction of arrow in FIG. 5, i.e., a distribution in a direction of the diameter of the wafer which is cut from the crystal in a direction perpendicular to the pull shaft. FIG. 4 shows a carrier concentration distribution in a crystal pull direction, as shown in FIG. 6. In FIG. 4, mark "●" indicates a carrier concentration at the center, and mark "o" indicates a carrier concentration at a position deviated from the center by 12 mm. In the carrier concentration distribution in the direction of the diameter of the wafer which was cut from the crystal in a direction perpendicular to the pull shaft, the carrier concentration was $(1 \pm 0.1) \times 10^{16}$ cm$^{-3}$ over the entire region, and a variation in carrier concentration was within 10%, as shown in FIG. 3. In the carrier concentration distribution in the direction of the crystal pull shaft, the carrier concentration was $1 \times 10^{16}$ cm$^{-3}$ over the entire region, as shown in FIG. 4, and its variation was within 10%.

In this embodiment, as described above, since CO gas is used as a p-type impurity, and the CO concentration in chamber 10 is controlled to be constant, carbon can be supplied at a constant rate to a GaAs single crystal which is pulled and manufactured. As a result, a p-type GaAs single crystal can be easily manufactured. In this case, unlike zinc, carbon can be supplied in a gas state, and is stable in GaAs. Therefore, the carrier concentration can be accurately controlled. Therefore, the single crystal of this embodiment can be satisfactorily used in a field effect transistor which requires strict control of a carrier concentration of a substrate material, and is very useful.

A product yield of a GaAs crystal substrate obtained from a single crystal ingot can be greatly improved, and a variation among produced crystals is small. Therefore, p-type GaAs crystal substrates having a uniform carrier concentration can be supplied with low cost. Furthermore, when a supply amount of CO gas is varied to change a gas concentration, a carrier concentration can be easily changed.

Figure 7:
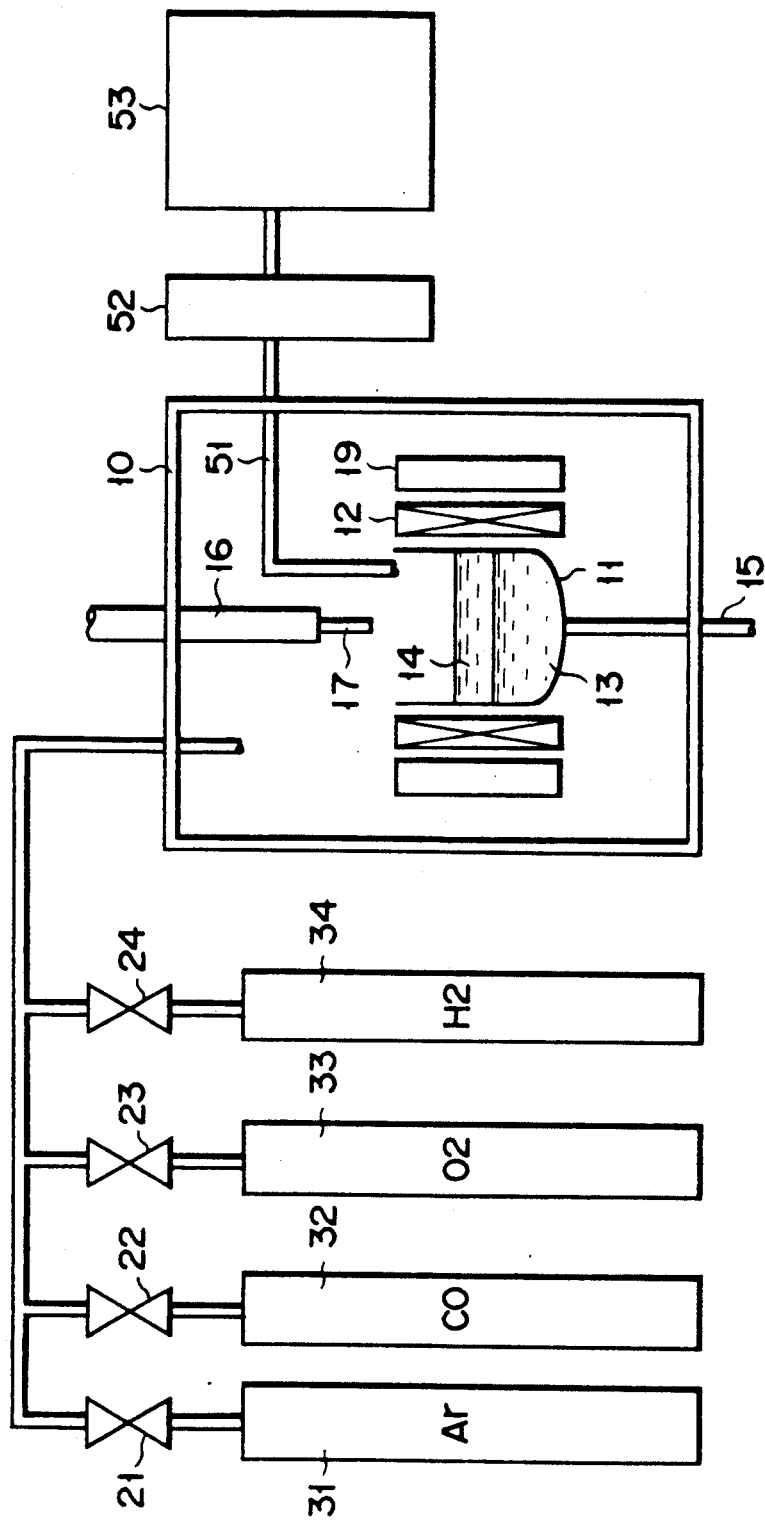
FIG. 7 is a view showing a GaAs single crystal manufacturing apparatus according to another embodiment of the present invention.

FIG. 7 is a schematic diagram showing a GaAs single crystal manufacturing apparatus according to another embodiment of the present invention. Note that the same reference numerals in FIG. 7 denote the same parts as in FIG. 1, and a detailed description thereof will be omitted.

Crucible 11 is placed in chamber 10, and heater 12 and heat shielding member 19 are concentrically arranged around crucible 11. Pipe 51 for sampling a gas in chamber 10, gas chromatograph device 53 for quantitatively analyzing the sampled gas, and flow rate adjuster 52 for supplying the sampled gas to gas chromatograph device 53 are attached to chamber 10. Chamber 10 is connected to argon cylinder 31 containing argon gas as a major component of an atmospheric gas, carbon monoxide cylinder 32, oxygen cylinder 33, and hydrogen cylinder 34. By opening valves (electromagnetic valves) 21, 22, 23, and 24, corresponding gases are supplied into chamber 10.

With this apparatus, a GaAs single crystal having uniform carbon and oxygen concentrations in the pull shaft direction can be obtained as in the previous embodiment. A method of manufacturing a semi-insulating GaAs single crystal using the apparatus shown in FIG. 7 will be described below.

First, a total of 4 kg of gallium and arsenic as GaAs raw materials were charged in crucible 11 to obtain an atomic ratio of Ga/As=0.95, and 700 g of $B_2O_3$ were then charged therein. After the interior of chamber 10 was evacuated to a vacuum of about $5 \times 10^{-2}$ Torr, valve 21 of argon gas cylinder 31 was opened to compress the interior of chamber 10 to about 40 atm. Thereafter, heater 12 was energized to start heating and to cause gallium to react with arsenic. The heating was continued to completely melt the raw materials to prepare raw melt 13, so that the surface of raw melt 13 was covered with $B_2O_3$ liquid sealant 14.

Then, the pressure in chamber 10 was reduced to 20 atm, and raw melt 13 was adjusted to a seeding condition tenperature. In this state, a gas near crucible 11 in chamber 10 was taken in gas chromatograph device 53 through pipe 51 and flow rate adjuster 52 arranged near the opening portion of crucible 11, so that a carbon monoxide concentration was measured by a hydrogen flame ionization detector (not shown) in device 53, and the hydrogen and oxygen concentrations were measured by a thermal conduction type detector (not shown) in device 53. Thereafter, valves 21 to 24 were adjusted so that the carbon monoxide, hydrogen, and oxygen concentrations in the argon gas coincided with preset concentrations. More specifically, if the measured concentrations were higher than the predetermined concentrations, the degree of opening of valve 21 of argon gas cylinder 31 was increased to supply argon gas into chamber 10, thereby diluting the atmosphere. However, if the measured concentrations were lower than the predetermined concentrations, the degrees of opening of valves 22, 23, and 24 were increased to supply carbon monoxide, hydrogen, and oxygen gases to chamber 10.

Crystal pull shaft 16 was then moved downward by a lift mechanism (not shown) and seed crystal 17 was brought into contact with raw melt 13 through liquid sealant 14. After seed crystal 17 was sufficiently wetted with raw melt 13, a pull operation was started by the lift mechanism. While a single crystal was pulled, carbon monoxide, hydrogen, and oxygen concentrations were measured at 10-minute intervals, and valves 21 to 24 were adjusted so that the carbon monoxide, hydrogen, and oxygen concentrations always coincided with the preset concentrations (normally, constant concentrations) in accordance with a pull weight at respective times.

Wafers were cut from a GaAs single crystal prepared in this manner and having a diameter of 85 mm and a weight of 3.5 kg, and their carbon concentrations were measured by an FTIR method and their oxygen concentrations were measured by a charge particle activation analysis method. As a result, in any of head, intermediate, and tail portions of the crystal, the carbon concentration fell within the range of 2 to $3 \times 10^{15}$ cm$^{-3}$, and the oxygenconcentraiton fell within the range of 4 to $5 \times 10^{15}$ cm$^{-3}$.

As described above, the components and concentrations of a gas atmosphere in chamber 10 were detected, and were controlled to be constant, and a single crystal having uniform carbon and oxygen concentrations in a pull shaft direction could be obtained. A similar single crystal pull operation was continuously repeated ten times. As a result, in a wafer which was cut from any portion of a single crystal, the carbon concentration fell within the range of 2 to $3 \times 10^{15}$ cm$^{-3}$, and the oxygen concentration fell within the range of 4 to $5 \times 10^{15}$ cm$^{-3}$. In addition, high reproducibility was demonstrated.

A method of manufacturing an n-type GaAs single crystal using the apparatus shown in FIG. 7 will now be described.

The n-type GaAs single crystal is manufactured following basically the same procedures as that of the semi-insulating GaAs described above, except that GaAs raw materials and silicon as an n-type impurity are charged in crucible 11. More specifically, n-type GaAs raw melt 13 doped with silicon as a dopant is formed in crucible 11, and its surface is covered with $B_2O_3$ liquid sealant 14. In this state, a GaAs single crystal is pulled and manufactured following the same procedures as described above.

Wafers were cut from an n-type GaAs single crystal having a diameter of about 55 mm and a weight of 1 kg, and their carrier concentrations were determined by Hall measurement. As a result, the carrier concentration fell within the range of 7 to $9 \times 10^{17}$ cm. In any of head, intermediate, and tail portions of the single crystal. More specifically, the concentrations of gas components in chamber 10 were detected and controlled, so that a single crystal having a uniform carrier concentration in the longitudinal direction of the crystal could be obtained.

Note that the present invention is not limited to the above embodiments. For example, a means for detecting a gas concentration is not limited to a gas chromatograph device, but may be any means which can easily detect a gas concentraiton. In the above embodiment, a crystal growth apparatus based on the LEC method has been exemplified. However, the present invention can be applied to any other apparatuses which can grow a single crystal from a raw melt by a method other than pulling. A crystal to be grown is not limited to GaAs, but may be any other compound semiconductors, e.g., GaP, InP, and the like.

$CO_2$ can be used as a supply source of carbon as a p-type impurity in place of CO. Furthermore, a gas material containing carbon as a major component can be used. The present invention is not limited to a crystal pull apparatus utilizing the LEC method but may be one which can dope carbon gas in a raw melt upon crystal growth. More specifically, the present invention can be applied to various other manufacturing apparatuses which do not have a closed tube type raw material container. Various other changes and modifications may be made within the spirit and scope of the invention.

As described above, according to the present invention, a raw material container containing a raw melt is placed in a predetermined gas atmosphere, and the concentrations of atmospheric gas components are controlled to be constant, so that a carrier concentration of the resultant crystal can be uniformed. Therefore, a compound semiconductor single crystal can be easily manufactured from a raw melt, and its carrier concentration can be uniformly controlled, thus allowing a wide application range.

What is claimed is:

1. A method of manufacturing a compound semiconductor single crystal, comprising the steps of:
   placing a container containing a raw melt of a compound semiconductor in an atmosphere containing a monitor gas consisting of hydrogen;
   detecting the concentration of said monitor gas in the atmosphere; and
   controlling the detected concentration of the monitor gas to a preset value.

2. A method according to claim 1, wherein said monitor gas is supplied to and exhausted from the atmosphere together with a dilution gas.

3. A method according to claim 2, wherein the concentration of said monitor gas is controlled by controlling supply of said monitor gas and said dilution gas to the atmosphere, and exhaust of said monitor gas and said dilution gas from the atmosphere.

4. A method according to claim 1, wherein the preset value to which the concentration of said monitor gas is controlled is set according to the pull weight of said single crystal.

5. A method according to claim 1, wherein the preset value to which the concentration of said monitor gas is controlled is set to a constant value.

6. A method according to claim 1, wherein said compound semiconductor single crystal comprises a group III-V compound semiconductor single crystal.

7. A method according to claim 6, wherein said group III-V compound semiconductor comprises a compound selected from the group consisting of GaAs, GaP, and InP.

8. A method according to claim 1, wherein said raw melt comprises a GaAs raw melt containing an n-type impurity, and said compound semiconductor single crystal comprises an n-type GaAs single crystal.

9. A method according to claim 8, wherein said n-type impurity comprises silicon.

10. A method according to claim 1, wherein said raw melt comprises a GaAs raw melt containing a p-type impurity, and said compound semiconductor single crystal comprises a p-type GaAs single crystal.

11. A method according to claim 10, wherein said p-type impurity comprises carbon.

12. A method of manufacturing a compound semiconductor single crystal, comprising the steps of: placing a container containing a raw melt of a compound semiconductor in an atmosphere consisting of hydrogen gas; detecting the concentration of said hydrogen gas in the atmosphere; and controlling the detected concentration of the hydrogen gas to a preset value.

13. A method according to claim 12, wherein said raw melt comprises a GaAs raw melt containing an n-type impurity, and said compound semiconductor single crystal comprises an n-type GaAs single crystal.

14. A method according to claim 13, wherein said n-type impurity comprises silicon.

15. A method of manufacturing a compound semiconductor single crystal, comprising the steps of:
   placing a container containing a raw melt of a compound semiconductor in an atmosphere containing a monitor gas consisting of hydrogen;
   detecting the concentration of said monitor gas int he atmosphere; and
   controlling the detected concentration of the monitor gas to a preset value which is a function of the pull weight of said single crystal.

* * * * *